United States Patent
Lee et al.

(10) Patent No.: US 7,939,909 B2
(45) Date of Patent: May 10, 2011

(54) DEVICE HAVING INDUCTORS AND CAPACITORS

(75) Inventors: Moon-chul Lee, Sungnam (KR); In-sang Song, Seoul (KR); Young-tack Hong, Suwon (KR); Sung-hye Jeong, Deajeon (KR); Jeong-yoo Hong, Seoul (KR); Byung-yoo Hong, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 62 days.

(21) Appl. No.: 11/655,915

(22) Filed: Jan. 22, 2007

(65) Prior Publication Data

US 2007/0115702 A1    May 24, 2007

Related U.S. Application Data

(62) Division of application No. 10/373,735, filed on Feb. 27, 2003, now Pat. No. 7,169,684.

(30) Foreign Application Priority Data

Mar. 5, 2002    (KR) .................................. 2002-11721

(51) Int. Cl.
*H01L 29/00*    (2006.01)
(52) U.S. Cl. .. 257/531; 257/532; 257/533; 257/E27.048
(58) Field of Classification Search ................. 257/531, 257/532, 533, E21.022, E21.048
See application file for complete search history.

(56) References Cited

U.S. PATENT DOCUMENTS

| 5,351,163 | A | * | 9/1994 | Dawson et al. | 361/321.1 |
| 5,382,925 | A | | 1/1995 | Hayashi et al. | |
| 5,689,138 | A | | 11/1997 | Dekker et al. | |
| 5,773,870 | A | | 6/1998 | Su et al. | |
| 5,825,092 | A | * | 10/1998 | Delgado et al. | 257/778 |
| 5,841,350 | A | | 11/1998 | Appalucci et al. | |
| 5,874,770 | A | | 2/1999 | Saia et al. | |
| 5,969,405 | A | * | 10/1999 | Aeugle | 257/531 |

(Continued)

FOREIGN PATENT DOCUMENTS

EP    0 836 229 A2    4/1998

(Continued)

OTHER PUBLICATIONS

Wolf, S., "Silicon Processing for the VLSI Era", vol. 2—Process Integration, Lattice Press, Sunset Beach, CA, US, pp. 273-275, (1990).

(Continued)

*Primary Examiner* — Shouxiang Hu
(74) *Attorney, Agent, or Firm* — Staas & Halsey LLP (57) ABSTRACT

An LC device having a substrate, a support layer having upper and lower sides formed on the substrate, inductors formed on either the upper or lower side of the support layer, and capacitors formed in the opposite side of the support layer. The support layer may be formed of a low-k dielectric material, and a connection portion may be provided to connect the inductors and capacitors in the support layer. The inductors and capacitors are disposed in a stacked structure on the upper and lower sides of the low-k dielectric support layer on the substrate, so that space efficiency may be maximized on the substrate. The low-k dielectric support layer provides support between the inductors and capacitors so that substrate loss is minimized and a Q factor of the inductors is enhanced.

19 Claims, 9 Drawing Sheets

U.S. PATENT DOCUMENTS

| | | | |
|---|---|---|---|
| 6,303,423 B1 | 10/2001 | Lin | |
| 6,317,948 B1 | 11/2001 | Kola et al. | |
| 6,437,418 B1 * | 8/2002 | Ferrari et al. | 257/531 |
| 6,495,903 B2 * | 12/2002 | Xu et al. | 257/531 |
| 6,590,473 B1 * | 7/2003 | Seo et al. | 333/185 |
| 6,649,998 B2 * | 11/2003 | Song | 257/532 |
| 6,800,920 B2 * | 10/2004 | Nishijima | 257/531 |
| 2002/0020894 A1 | 2/2002 | Nishijima | |
| 2002/0142512 A1 | 10/2002 | Ma et al. | |

FOREIGN PATENT DOCUMENTS

| | | |
|---|---|---|
| JP | UM 50-117744 | 1/1974 |
| JP | UM 53-39163 | 1/1976 |
| JP | 4-337913 | 11/1992 |
| JP | 5-234811 | 9/1993 |
| JP | 6-151181 | 5/1994 |
| JP | 6-163321 | 6/1994 |
| JP | 8-236353 | 9/1996 |
| JP | 10-214722 | 8/1998 |
| JP | 11-103229 | 4/1999 |
| JP | 2001-308667 | 11/2001 |

OTHER PUBLICATIONS

Notice of Allowance for related U.S. Appl. No. 10/373,735; dated Sep. 15, 2006.

Office Action for related for related U.S. Appl. No. 10/373,735; dated Jun. 15, 2006.

Office Action for related for related U.S. Appl. No. 10/373,735; dated Dec. 29, 2005.

Office Action for related for related U.S. Appl. No. 10/373,735; dated Mar. 21, 2005.

Office Action for related for related U.S. Appl. No. 10/373,735; dated Sep. 2, 2004.

Office Action for related for related U.S. Appl. No. 10/373,735; dated Dec. 2, 2003.

European Search Report mailed Aug. 6, 2009 and issued in corresponding European Patent Application 03004397.0.

* cited by examiner

DEVICE HAVING INDUCTORS AND CAPACITORS

CROSS REFERENCE TO RELATED APPLICATION

This is a divisional application based on application Ser. No. 10/373,735, filed Feb. 27, 2003, now U.S. Pat. No. 7,169,684 the entire contents of which is hereby incorporated by reference.

BACKGROUND OF THE INVENTION

1. Field of the Invention

The present invention relates to an LC device and a fabrication method thereof. More particularly the present invention relates to an LC device and a fabrication method thereof capable of improving an inductor device.

2. Description of the Prior Art

Figure 1A:
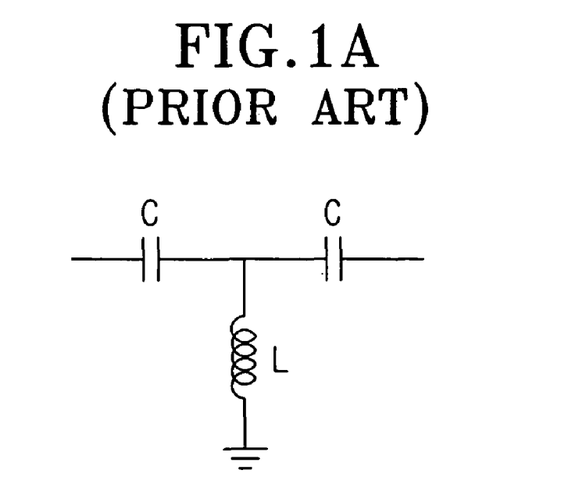
FIGS. 1A and 1B illustrate views showing conventional configurations of a high-pass filter and a low-pass filter, respectively.
Figure 1B:
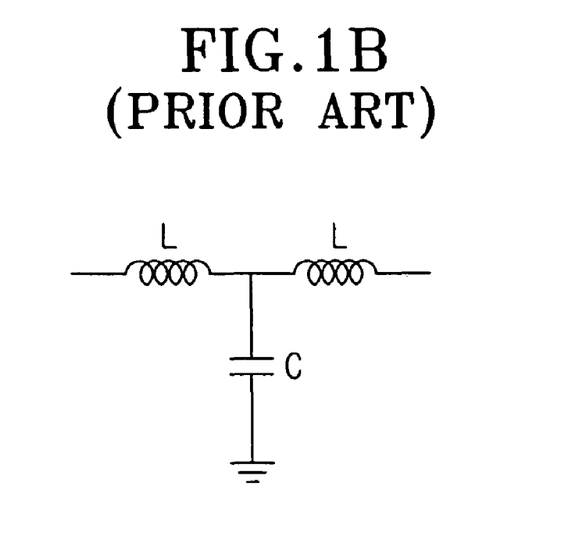
Figure 2:
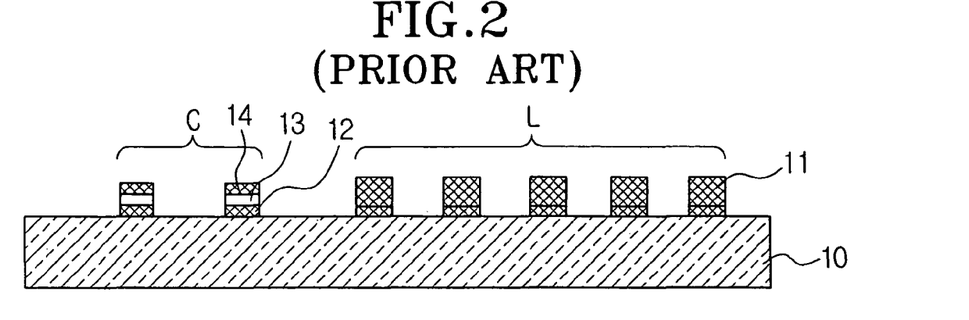
FIG. 2 illustrates a cross-sectional view of a high-pass filter of a conventional LC device.
Figure 3:
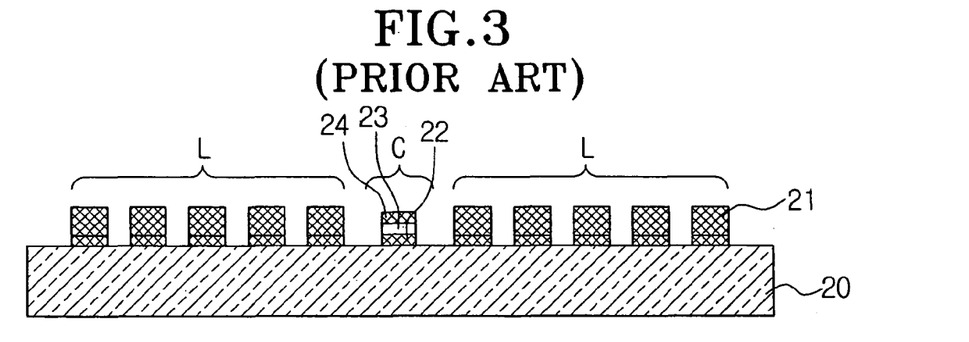
FIG. 3 illustrates a cross-sectional view of a low-pass filter of a conventional LC device.

FIGS. 1A and 1B illustrate views showing conventional configurations of a high-pass filter and a low-pass filter using general LC devices, and FIGS. 2 and 3 illustrate cross-sectional views of the high-pass filter and low-pass filter of FIGS. 1A and 1B, respectively.

As shown in FIGS. 2 and 3, general high-/low-pass filters have inductors L and capacitors C formed on substrates 10 and 20. Inductors 11 and 21 are generally formed by depositing a metal layer on the substrates 10 and 20, and then patterning the metal layer to form the inductors L. A protective layer (not shown) may be formed on the inductors L, and then the capacitors C are formed as shown in FIGS. 2 and 3. The capacitors C are manufactured by sequentially forming lower electrode layers 12 and 22, dielectric layers 13 and 23 having a high dielectric constant (high-k dielectric), and upper electrode layers 14 and 24.

In the conventional low- and high-pass filters of FIGS. 2 and 3, an area of the inductors L formed on the substrates 10 and 20 is relatively larger than that of the capacitors C, so that the size of an LC device becomes large.

Further, a method for implementing LC devices in the air, so that the LC devices are external to a substrate for enhancing the operating characteristics of the LC devices, is difficult when various devices are formed in one layer on the substrate.

SUMMARY OF THE INVENTION

To solve the above-mentioned problems, it is a feature of an embodiment of the present invention to provide LC devices having maximized space efficiency and enhanced operating performance and a fabrication method thereof in which space efficiency is maximized and performance of the devices is enhanced.

Accordingly, an LC device is provided including a substrate; a support layer having an upper side and a lower side formed on the substrate, the upper side and lower side of the support layer being opposite each other; inductors formed on either the upper side or the lower side of the support layer; and capacitors formed on the side of the support layer that is opposite the side on which the inductors are formed. Therefore, the inductors and capacitors formed on the upper and lower sides of the support layer are formed in a stacked structure relative to each other.

Preferably, the support layer is formed of a dielectric material having a low dielectric constant (a low-k dielectric). Preferably, the support layer is supported by the substrate and the substrate is patterned such that the inductors or capacitors formed on the lower side of the support layer are exposed to the air. Further, a connection portion is formed through the support layer for electrically connecting the inductors and the capacitors formed on the upper and lower sides of the support layer.

A method for fabricating an LC device according to the present invention includes forming either inductors or capacitors in a substrate; forming a support layer having an upper side and a lower side on the substrate in which either the inductors or the capacitors are formed; and forming in the upper side of the support layer inductors if capacitors were previously formed in the substrate or capacitors if inductors were previously formed in the substrate. Preferably, the method further includes forming a connection portion through the support layer, which is preferably formed of a low-k dielectric material.

The method may further include etching regions of the substrate in which the inductors and the capacitors are formed, the regions being disposed under the support layer. Accordingly, the inductors and the capacitors are formed in a stacked structure, so that space efficiency may be maximized on the substrate.

Further, the support layer of a low-k dielectric material is formed to provide support between the inductors and the capacitors so that substrate loss is minimized and the characteristics of an LC device may be enhanced by the enhanced characteristics, or Q factor, of the inductors.

BRIEF DESCRIPTION OF THE DRAWINGS

These and other features and advantages of the present invention will become more apparent by describing in detail a preferred embodiment thereof with reference to the attached drawings, in which.

DETAILED DESCRIPTION OF THE INVENTION

Korean Patent Application No. 2002-11721, filed on Mar. 5, 2002, and entitled: "Device Having Inductors and Capacitors and a Fabrication Method Thereof," is incorporated herein by reference in its entirety.

Hereinafter, an LC device configured as a high-pass filter according to an embodiment of the present invention will be described with reference to the accompanying drawings.

Figure 4A:
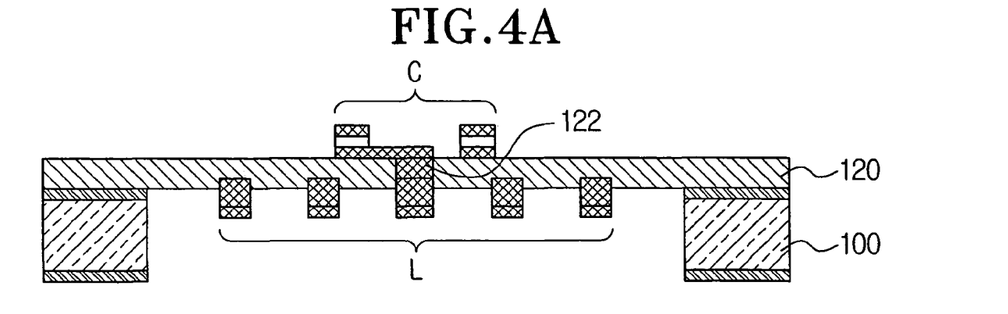
FIGS. 4A and 4B illustrate cross-sectional views of high-pass filters according to embodiments of the present invention.
Figure 4B:
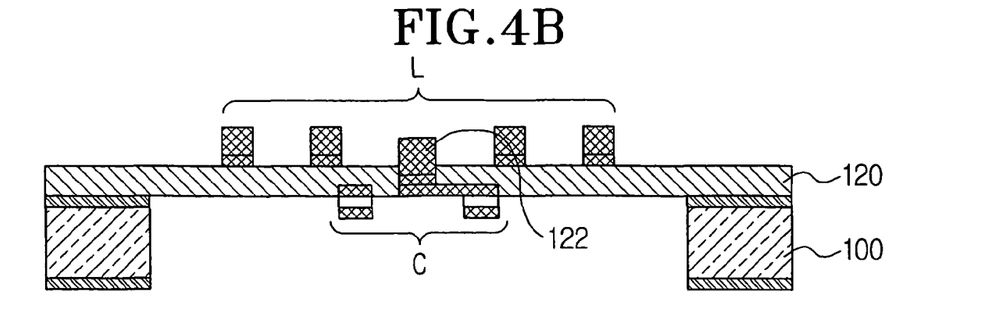

As shown in FIGS. 4A and 4B, a high-pass filter has a substrate 100, a support layer 120 formed on the substrate 100, inductors L formed on a lower side of the support layer 120, and capacitors C formed on an upper side of the support layer 120, as shown in FIG. 4A. However, the inductors L may be formed on the upper side of the support layer 120, and the capacitors C may be formed on the lower side of the support layer 120, as shown in FIG. 4B, provided the inductors L and the capacitors C are formed on opposite sides of the support layer 120. Further, a connection portion 122 is provided through the support layer 120 in order to electrically connect the inductors L and the capacitors C.

The substrate 100 is preferably formed of silicon, and is either a semiconductor or a dielectric.

The support layer 120 is preferably formed of a low-k dielectric material such as bicyclobutene (BCB), a polymer-series material or any other low-k dielectric material. Coating a low-k dielectric material on the silicon substrate 100 may prevent deterioration of characteristics of the inductors L due to the silicon substrate 100 and the capacitors C.

The inductors L and the capacitors C are preferably formed of a metal material such as copper Cu, and are preferably disposed on the lower and upper sides of the support layer 120, so that the inductors L and the capacitors C are disposed on opposite sides of the support layer 120 in a stacked structure. At this time, the substrate 100 on the lower side of the support layer 120 is etched so that the inductors L and the capacitors C formed on the lower and upper sides of the support layer 120 are respectively disposed in the air.

Figure 5A:
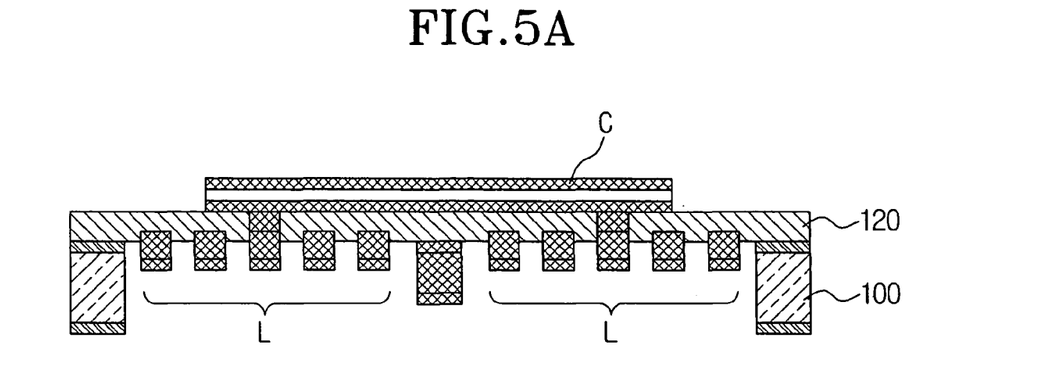
FIGS. 5A and 5B illustrate cross-sectional views of low-pass filters according to embodiments of the present invention.
Figure 5B:
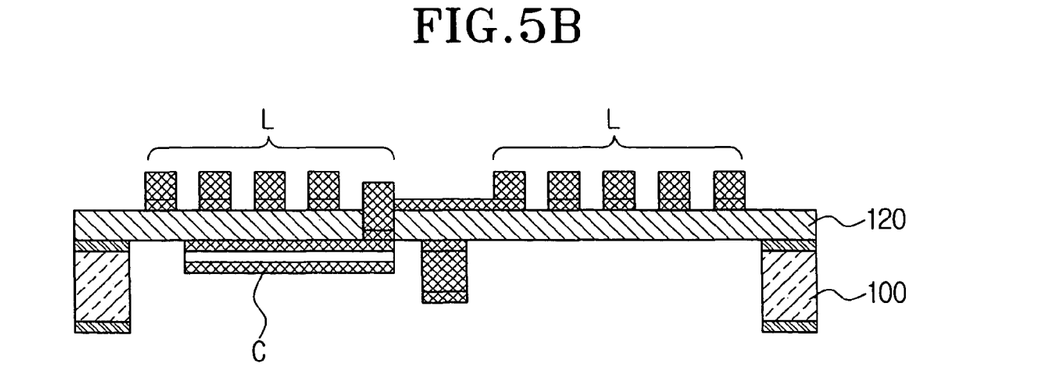

Thus far, an LC device according to the present invention having a structure of a high-pass filter has been described, but, as shown in FIGS. 5A and 5B, an LC device having a structure of a low-pass filter may also be diversely designed by the present invention, and further, a variety of other LC devices may be designed according to the present invention by applying the diverse structures of inductors and capacitors to other devices.

Hereinafter, a process for manufacturing an LC device according to an embodiment of the present invention, having a structure of the high-pass filter of FIG. 4A, will be described in detail with reference to FIGS. 6A to 6I.

Figure 6A:
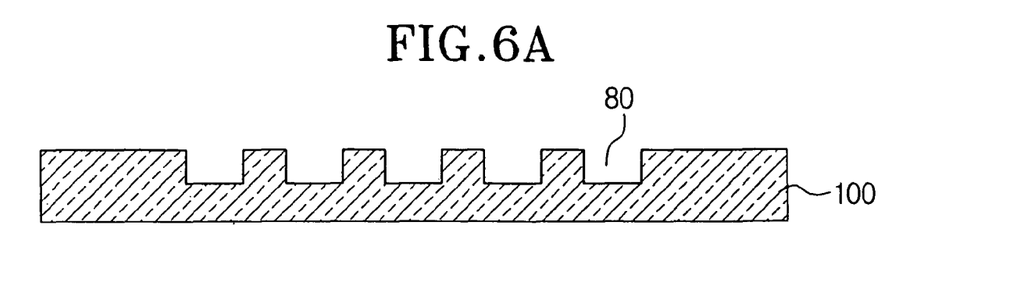
FIGS. 6A to 6I illustrate views for sequentially showing a process of manufacturing the high-pass filter of FIG. 4A according to an embodiment of the present invention.

First, as shown in FIG. 6A, portions of a substrate 100 are etched to form recesses 80 for inductors to be formed therein.

Figure 6B:
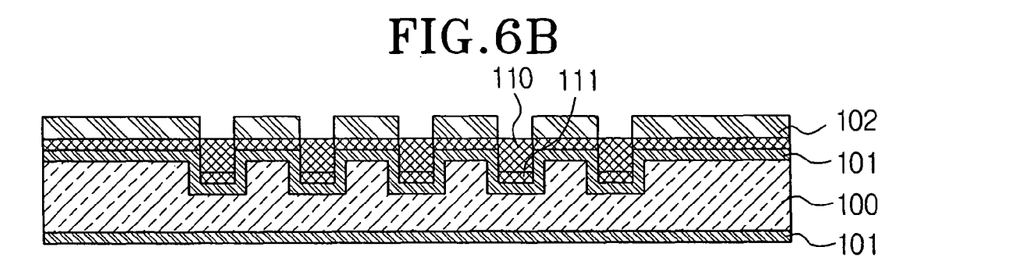

As shown in FIG. 6B, a mask oxide layer 101 is deposited on upper and lower sides of the substrate 100. Next, a metal seed layer 111 is formed on the substrate 100 in recesses 80, at a region where inductors 110 will be formed, and a photoresist layer 102 is formed on the substrate 100 and patterned as shown in FIG. 6B. After the photoresist layer 102 is patterned, a metal substance such as copper Cu is coated on the substrate 100 to fill the recesses 80 in the substrate 100, so that inductors 110 are formed.

Figure 6C:
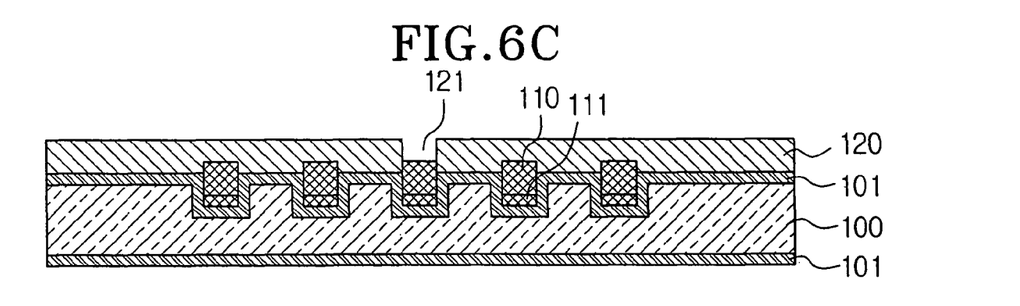

Thereafter, as shown in FIG. 6C, the photoresist layer 102 is removed and a support layer 120, formed of a low-k dielectric material, is formed on the substrate 100 on which the inductors 110 are formed. Further, a connection opening 121 is formed in the support layer 120 to allow electrical connectivity with a capacitor (130 of FIGS. 6F-6I) to be described later. Bicyclobutene (BCB), polymer-series substances, and the like may be used as the low-k dielectric material of the support layer 120.

Figure 6D:
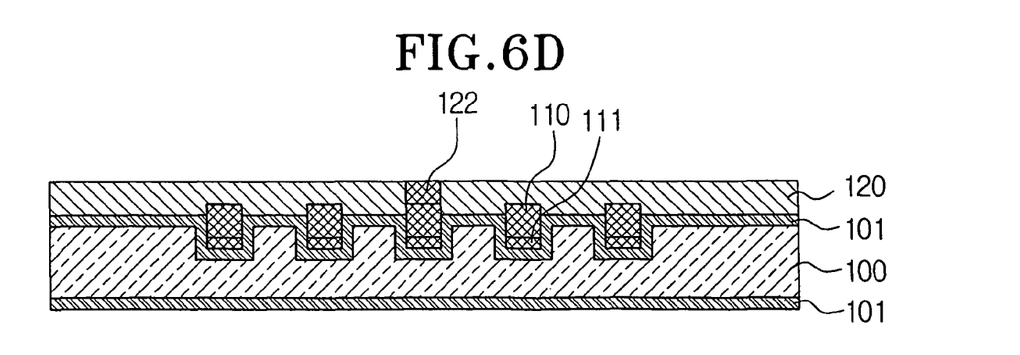

Thereafter, as shown in FIG. 6D, a metal substance is filled in the connection opening 121 in a coating process to form a connection portion 122.

Figure 6E:
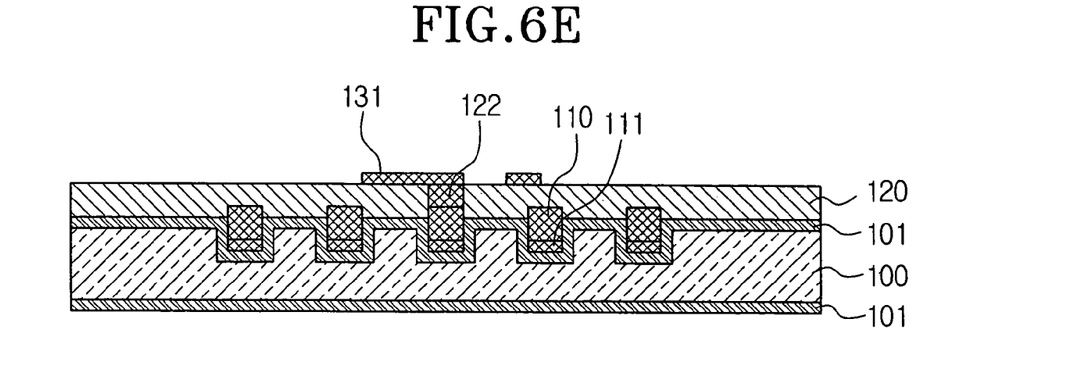
Figure 6F:
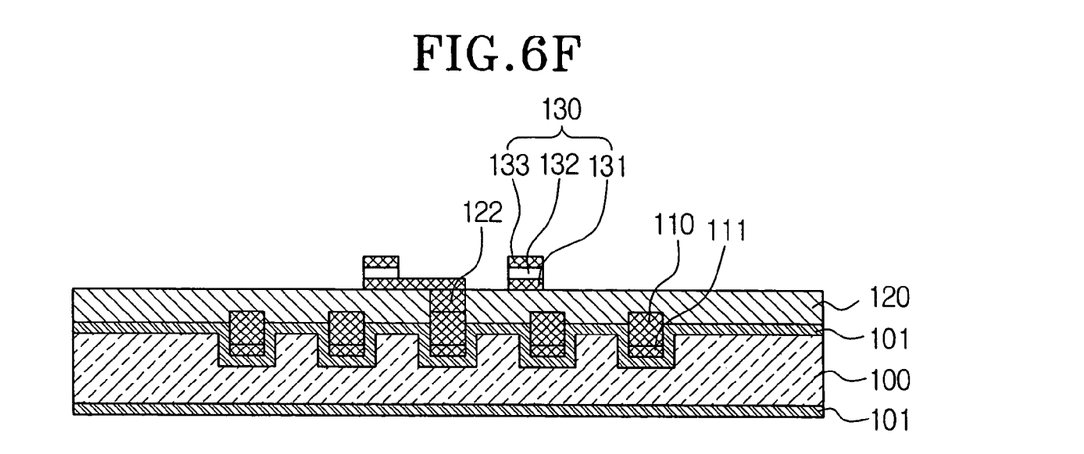

As shown in FIG. 6E, a lower electrode layer 131 of capacitors 130 of FIG. 6F is formed on the upper side of the support layer 120 corresponding to the location of the inductors 110 formed on the lower side of the support layer 120 in order for the capacitors 130 to be disposed in a stacked structure at the location of the inductors 110 formed in the substrate 100. At this time, a metal substance such as platinum Pt is deposited and patterned to form the lower electrode layer 131 connected to the inductors 110 by the connection portion 122.

Then, as shown in FIG. 6F, a capacitor dielectric 132 such as $SiO_2$, $SiN_4$, STO, or the like, is deposited and patterned on the lower electrode layer 131, and a metal substance such as copper Cu is deposited and patterned to form an upper electrode layer 133 on the capacitor dielectric 132 to form the capacitors 130.

The inductors 110 and the capacitors 130 are disposed in a stacked structure and are supported by the low-k dielectric support layer 120

Figure 6G:
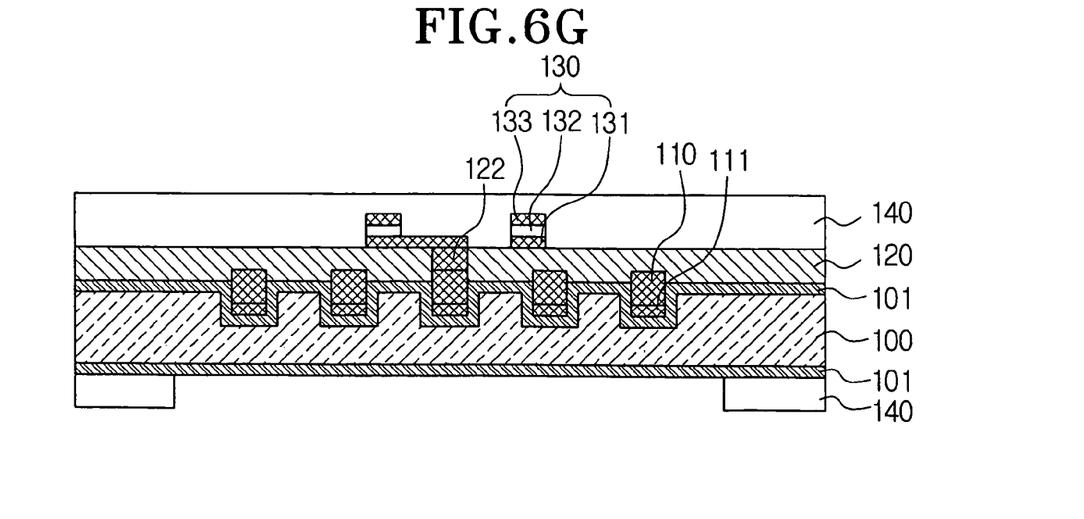

Next, as shown in FIG. 6G, protection layers 140 are formed on the upper and lower sides of the substrate 100, respectively, and patterned in correspondence to areas of the substrate 100 to be etched. The areas of the substrate 100 to be etched correspond to the lower side of the support layer 120 in which the inductors 110 are formed. Therefore, the protection layer 140 on the lower side of the substrate 100 is patterned so that the protection layer is removed at a region corresponding to the region of the support layer 120 in which the inductors 110 are formed, as illustrated in FIG. 6G. The mask oxide layer 101 is etched in the region where the protection layer 140 has been removed.

Figure 6H:
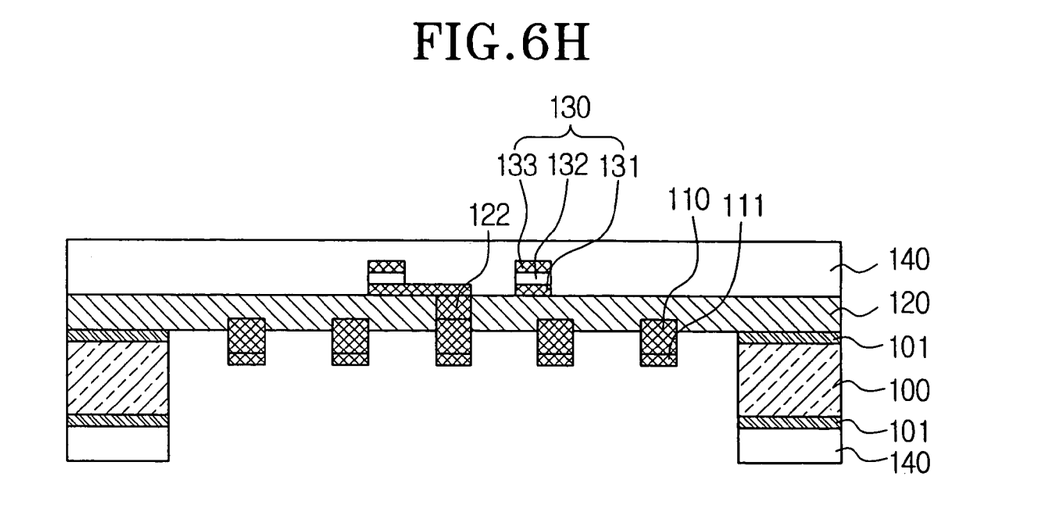
Figure 6I:
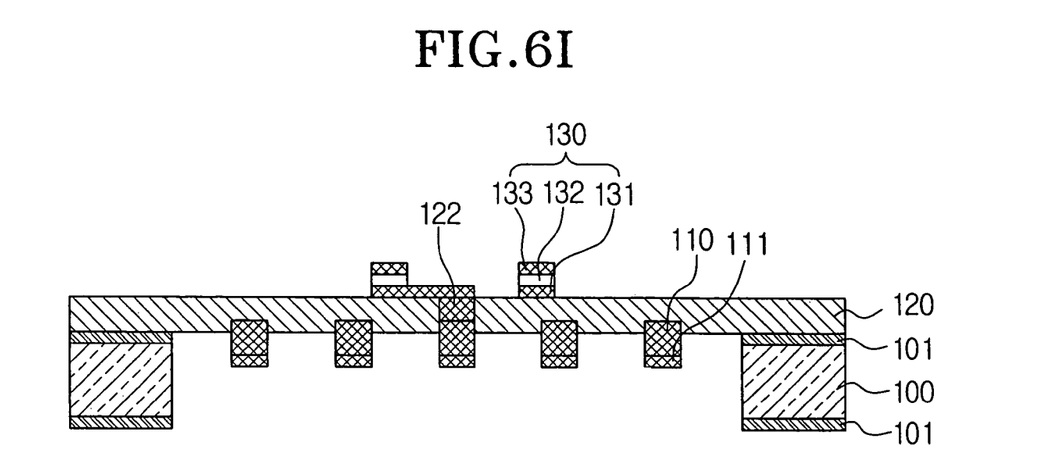

The substrate 100 on the lower side of the support layer 120 in which the inductors 110 are formed is etched as shown in FIG. 6H, and the protection layers 140 formed on the lower and upper sides of the substrate 100 are removed, to thereby form an LC high-pass filter as shown in FIG. 6I.

Accordingly, the inductors 110 and the capacitors 130 are disposed in a stacked structure with respect to the low-k dielectric support layer 120 and with respect to each other, thereby maximizing space efficiency of the substrate in the LC device. Further, etching the substrate as shown in FIG. 6H allows the inductor 110 to be supported by the low-k dielectric support layer and disposed in the air, rather than on the substrate, thereby reducing a parasitic effect with the substrate, and therefore enhancing the characteristic value (Q factor) of the inductor.

Hereinafter, a process for manufacturing an LC high-pass filter according to an embodiment of the present invention as shown in FIG. 4B will be described in detail with reference to FIGS. 7A to 7I, in which like reference numerals denote like parts.

Figure 7A:
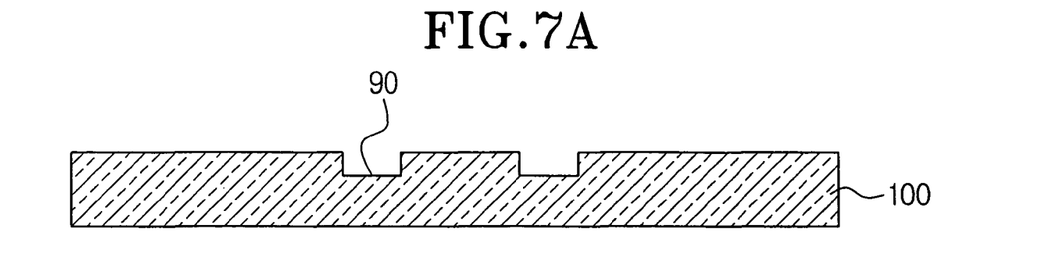
FIGS. 7A to 7I illustrate views for sequentially showing a process of manufacturing the high-pass filter of FIG. 4B according to another embodiment of the present invention.
Figure 7B:
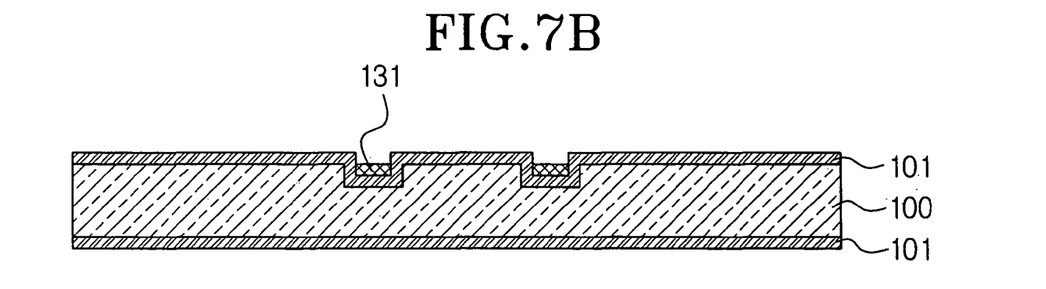

First, as shown in FIG. 7A, portions of the substrate 100 are etched to form recesses 90, so that capacitors may be formed therein. As shown in FIG. 7B, a mask oxide layer 101 is deposited on upper and lower sides of the substrate 100 for etching the substrate 100, which will be described later. Then, a metal substance such as platinum Pt is deposited and patterned in the recesses 90 to form a lower electrode 131 of the capacitors.

Figure 7C:
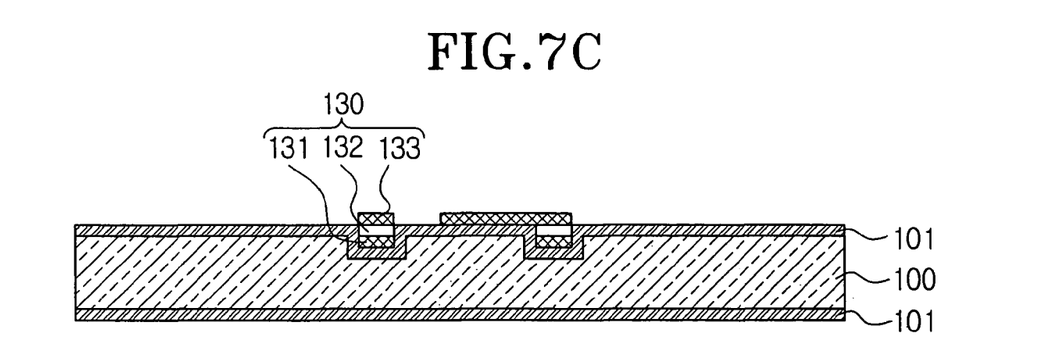

Next, as shown in FIG. 7C, a capacitor dielectric 132 having a high dielectric constant (a high-k dielectric) is disposed and patterned on the lower electrode layer 131, and a metal layer such as copper Cu is disposed and patterned to form an upper electrode layer 133 on the capacitor dielectric 132 to form capacitors 130.

Figure 7D:
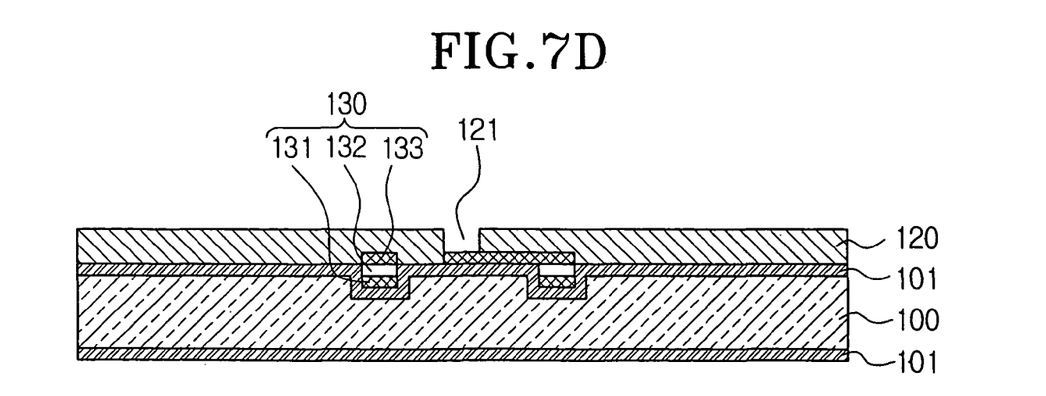

Thereafter, as shown in FIG. 7D, a low-k dielectric support layer 120 is coated on the substrate 100 in which the capacitors 130 are formed. The low-k dielectric support layer 120 will serve to support inductors, to be described later. A connection opening 121 is patterned in the low-k dielectric support layer 120 to electrically connect the capacitors 130 and the inductors 110 of FIG. 7E.

Figure 7E:
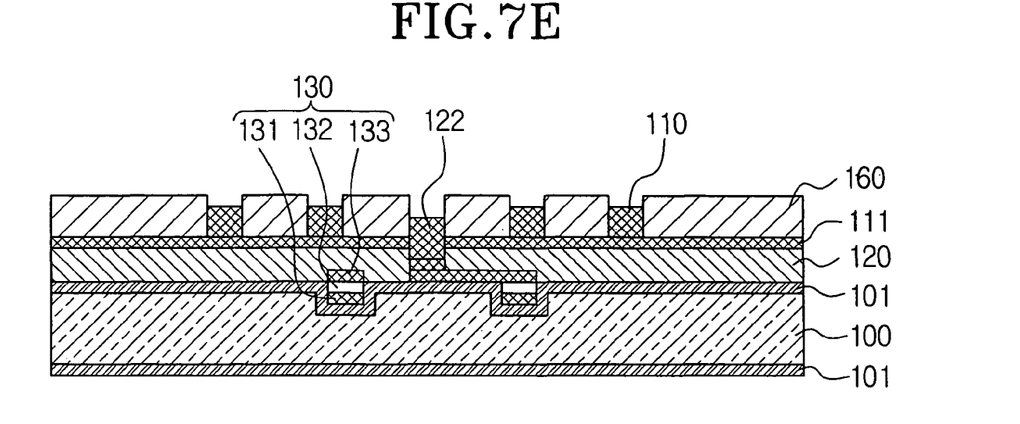

As shown in FIG. 7E, to form the inductors 110, a metal substance such as copper Cu is deposited to form a seed metal layer 111 on the low-k dielectric support layer 120. A mask 160 is formed on the substrate 100 and patterned to have openings at regions in which the inductors 110 and the connection opening 121 are formed. A metal substance is filled in the openings of the mask 160 and the connection opening 121, so that the inductors 110 and connection portion 122 are formed.

Figure 7F:
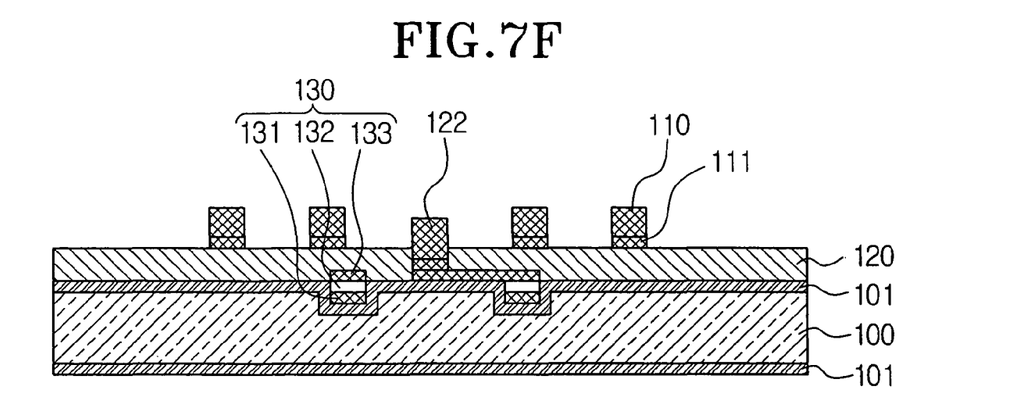

Next, as shown in FIG. 7F, the mold 160 is removed, and the seed metal layer 111 is patterned.

Figure 7G:
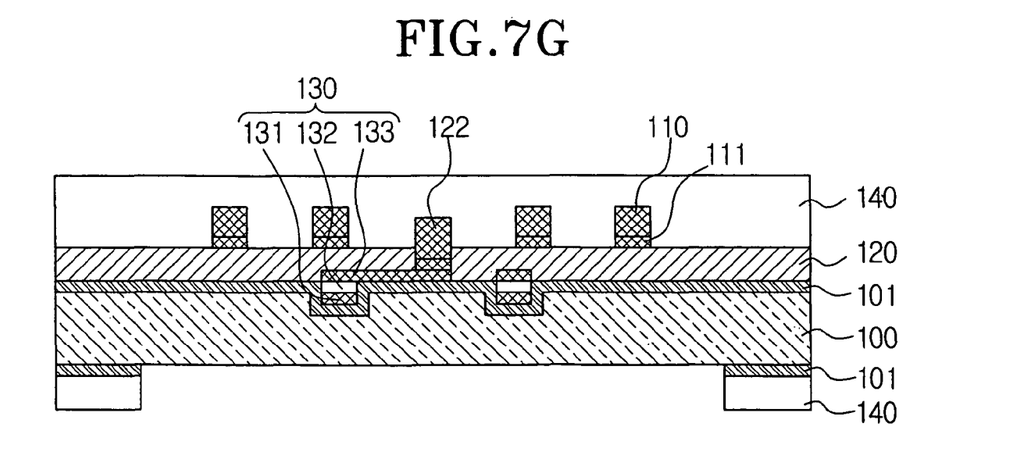
Figure 7H:
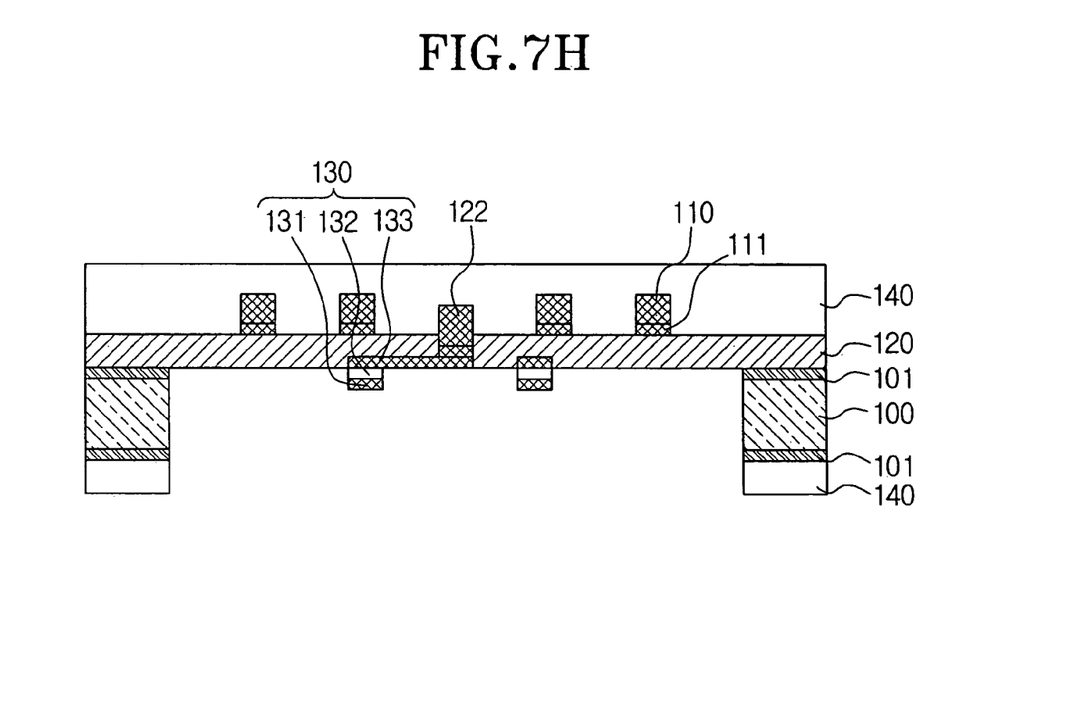

As shown in FIG. 7G, a protection layer 140 is formed on lower and upper sides of the substrate 100, respectively, and the protection layer 140 on the lower side of the substrate 100 is patterned at a region of the substrate 100 in which the capacitors 130 are formed. The mask oxide layer 101 is etched in the region where the protection layer 140 has been removed. Thereafter, as shown in FIG. 7H, the region of the substrate 100 in which the capacitors 130 are formed is etched.

Figure 7I:
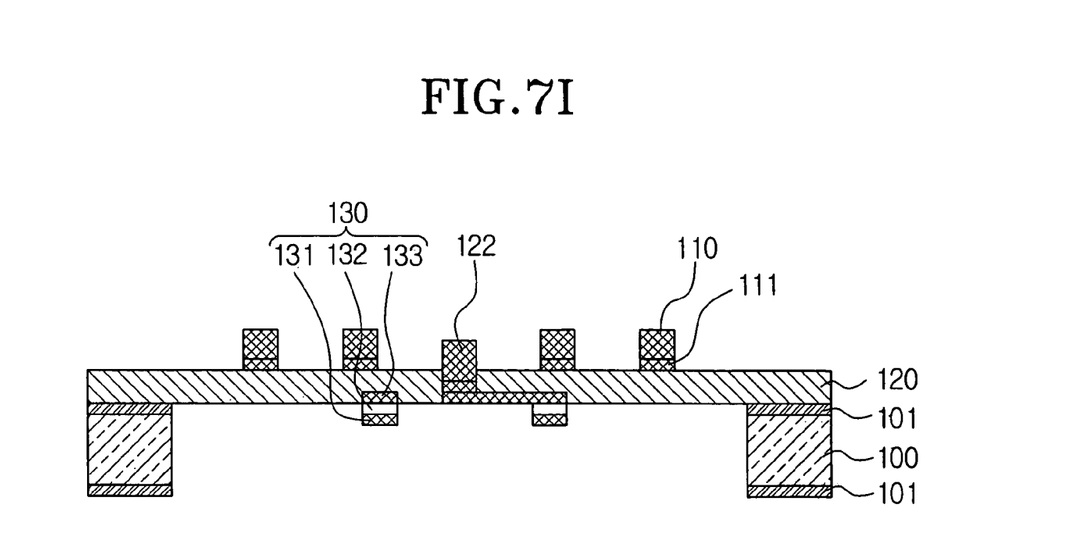

When the protection layers 140 formed on the lower and upper sides of the substrate 100 are removed, a high-pass filter according to another embodiment of the present invention is fabricated as shown in FIG. 7I.

As shown in FIGS. 5A and 5B, a low-pass filter according to the present invention has the same structure as that of the high-pass filter described above except for the number and design of the inductors L and capacitors C.

As described in the above embodiments, the inductors L and the capacitors C are disposed in a stacked structure on lower and upper sides of a support layer formed of a low-k dielectric material, thereby maximizing the space efficiency on the substrate.

Further, because the inductors L and capacitors C are supported by the low-k dielectric support layer, substrate loss that occurs when the inductors L and the capacitors C are supported by the existing dielectric substrate may be minimized, thereby enhancing the inductor characteristics (Q factor) by minimizing a parasitic effect with the substrate.

According to the present invention, space efficiency in an LC device may be maximized by disposing the inductors and capacitors in a stacked structure supported by layers formed of a low-k dielectric material, rather than disposing devices in one layer on the substrate, as in a conventional structure.

Further, since the inductors are supported by a low-k dielectric layer and are disposed in the air, rather than on a substrate, a parasitic effect with the substrate, which adversely affects the characteristics of conventional inductors, may be reduced, and the inductor characteristics (Q factor) of the present invention may thereby be enhanced.

Preferred embodiments of the present invention have been disclosed herein, and although specific terms are employed, they are used in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. An LC device, comprising:
a patterned substrate including a hollow space;
a support layer having an upper side and a lower side on the substrate and the hollow space, the upper side and the lower side of the support layer being opposite each other, and the lower side of the support layer facing the substrate;
at least a portion of at least one inductor on either the upper side or the lower side of the support layer; and
at least a portion of at least one capacitor on the side of the support layer that is opposite the side on the which the at least one inductor is formed,
wherein one of the at least one inductor and the at least one capacitor is partially embedded in the support layer and partially protrudes from the lower side of the support layer, and
wherein at least a portion of the hollow space laterally extends from inner side surfaces that face one another of the substrate and is defined between the inner side surfaces of the substrate, at least a portion of the lower side of the support layer and the partially protruding portion of the at least one inductor or the at least one capacitor.

2. The LC device as claimed in claim 1, wherein the support layer includes a material having a low dielectric constant.

3. The LC device as claimed in claim 2, wherein the material of the support layer having a low dielectric constant is bicyclobutene (BCD) or a polymer-series substance.

4. The LC device as claimed in claim 1, wherein the support layer is supported by the substrate, and the hollow space of the substrate is between inner facing surfaces of the patterned substrate, the at least one inductor or capacitor on the lower side of the support layer being exposed to the air in the hollow space between the inner facing surfaces of the patterned substrate, and the at least one inductor or capacitor on the lower side of the support layer being spaced apart from the inner facing surfaces of the patterned substrate along a horizontal direction, the horizontal direction being substantially parallel to the support layer.

5. The LC device as claimed in claim 1, further comprising a connection portion through the support layer for electrically connecting the at least one inductor and the at least one capacitor on the upper and lower sides of the support layer.

6. The LC device as claimed in claim 1, wherein the at least one inductor and the at least one capacitor on the upper and lower sides of the support layer have a stacked structure relative to each other.

7. The LC device as claimed in claim 1, wherein at least a portion of one of the at least one inductor and the at least one capacitor is in the support layer.

8. The LC device as claimed in claim 7, wherein a portion of all of inductors or capacitors is in the support layer.

9. The LC device as claimed in claim 7, wherein a portion of one of each inductor and capacitor is in the support layer.

10. The LC device as claimed in claim 1, wherein the substrate is one of a semiconductor and a dielectric.

11. The LC device as claimed in claim 10, wherein the substrate is silicon.

12. The LC device as claimed in claim 1, wherein the at least one capacitor is on the upper side of the support layer and the at least one inductor is on the lower side of the support layer.

13. The LC device as claimed in claim 12, wherein the at least one capacitor extends across the at least one inductor.

14. The LC device as claimed in claim 13, further comprising at least two inductors, wherein the at least one capacitor extends across the at least two inductors.

15. The LC device as claimed in claim 1, wherein the at least one inductor is on the upper side of the support layer and the at least one capacitor is on the lower side of the support layer.

16. The LC device as claimed in claim 15, wherein the at least one capacitor extends across the at least one inductor.

17. The LC device as claimed in claim 16, further comprising at least two inductors, wherein the at least one capacitor extends across the at least two inductors.

18. The LC device as claimed in claim 1, wherein the hollow space in the patterned substrate extends through the entire substrate along a vertical direction, the vertical direction being perpendicular to the support layer.

19. The LC device as claimed in claim 18, wherein the support layer overlaps the entire hollow space of the patterned substrate.

* * * * *